United States Patent [19]

Miyaoka et al.

[11] Patent Number: 5,411,622
[45] Date of Patent: May 2, 1995

[54] METHOD AND APPARATUS FOR RETAPING ELECTRONIC PARTS

[75] Inventors: Takeshi Miyaoka; Katsumi Ueno, both of Saitama, Japan

[73] Assignee: Citizen Watch Co., Ltd., Tokyo, Japan

[21] Appl. No.: 176,466

[22] Filed: Jan. 3, 1994

[30] Foreign Application Priority Data

Jan. 18, 1993 [JP] Japan ................... 5-023323

[51] Int. Cl.6 .......................... B32B 31/10
[52] U.S. Cl. .................... 156/265; 156/344; 156/519; 156/584; 83/32; 83/42; 83/107; 83/409.2; 83/411.3; 83/733; 29/809; 221/73
[58] Field of Search ........... 156/344, 584, 265, 519; 221/73; 83/27, 31, 32, 42, 107, 409.1, 409.2, 411.3, 733; 29/809

[56] References Cited

U.S. PATENT DOCUMENTS

| | | | |
|---|---|---|---|
| 3,750,504 | 8/1973 | Sidler | 83/27 X |
| 3,773,591 | 11/1973 | Blair | 156/265 |
| 3,878,026 | 4/1975 | Snyder et al. | |
| 3,911,646 | 10/1975 | Larkin et al. | 221/73 X |
| 4,069,931 | 1/1978 | Saylors | 156/584 X |
| 4,213,286 | 7/1980 | Ragard | |
| 4,270,651 | 6/1981 | Ragard et al. | |
| 4,279,682 | 7/1981 | Hamagami et al. | 156/519 X |
| 4,338,763 | 7/1982 | Ragard | |
| 4,607,761 | 8/1986 | Wright et al. | 221/73 X |
| 4,795,526 | 1/1989 | Lightner et al. | 156/344 |
| 5,218,894 | 6/1993 | College et al. | 83/42 X |
| 5,259,911 | 11/1993 | Ohnishi et al. | 221/25 X |

FOREIGN PATENT DOCUMENTS 58-165400 9/1983 Japan.
62-118004 7/1987 Japan.
3101300 4/1991 Japan.

Primary Examiner—Mark A. Osele
Attorney, Agent, or Firm—Dickinson, Wright, Moon, Van Dusen & Freeman

[57] ABSTRACT

Electronic parts that have axially extending leads are separated from a first strip on which they are supplied for being rearranged and retaped to provide a second strip for supply to an automatic assembly machine. The parts are separated from the first strip by cutting the strip transverse to the strip at locations between adjacent parts. The tape chips remaining on the separated parts are removed by engaging them with movable jigs, located on opposite sides of a body portion of the part, and by moving the jigs along the leads away from the body portion. The jigs are mounted on a rotating rotor and engage grooves in a stationary cam. The jigs move toward and away from each other by the engagement with the grooves as the jigs are moved around the stationary cam. After the parts are separated and the tape chips removed, the parts are transferred to a retaping machine to be attached to the second strip.

19 Claims, 14 Drawing Sheets

METHOD AND APPARATUS FOR RETAPING ELECTRONIC PARTS

TECHNICAL FIELD

This invention relates to the art of assembly of electronic devices. In particular, the invention relates to a method and apparatus for separating electronic parts from a first tape of parts and for retaping the parts.

BACKGROUND

Electronic components (parts), such as resistors and capacitors are well known and often have axial lead wires. These components are typically mounted on a printed circuit board for combination with other parts in a circuit. The mounting of these parts on the circuit board is accomplished by an automatic mounting apparatus, which receives groups of parts and rearranges them for assembly onto the circuit board. The parts of a given type are supplied to the automatic apparatus on a tape that is wound on a spool, and the automatic apparatus must separate the parts from the tape and rearrange the parts for use by an automatic assembly apparatus. The rearranged parts are retaped for use by an automatic assembly machine.

One prior art machine, disclosed in JITSU-KAI-SHO 62-118004, (Published utility model document No. 118004 of 1987) separates parts from a strip of parts by cutting the lead wires. The parts having the shortened lead wires are then retaped after rearrangement. This method suffers from the drawback that the wires are shortened by the separation process, which wastes a significant amount of material.

Another prior art machine is shown in TOKU-KAI-SHO 58-165400 (Published patent document No. 165400 of 1983). This machine removes the electronic parts from tape strips by heating the tapes to soften the adhesive and then pulling the tape strips away from the lead wires. This method has the drawback that the softened adhesive is sticky and a significant amount of the adhesive remains on the lead even after the tape has been pulled away. This remaining adhesive disrupts the operation of the retaping machine.

SUMMARY OF THE INVENTION

In accordance with the invention, each of the electronic parts is separated from the parallel, elongated tapes on which a plurality of the parts is supplied by cutting the tapes. The tapes are preferably cut in a direction that is transverse to the tape by a moving blade, and the separated parts having chips of the tape still adhered to the ends of the lead wires are conveyed to a device that removes these tape chips by engaging them and pulling them from the lead wires. The electronic part is then transported to an apparatus for retaping the parts.

By this process, the original lengths of the lead wires is maintained, and the lead wires are free from vestiges of the tape. Thus, material is conserved, and subsequent taping operations are not obstructed.

DETAILED DESCRIPTION OF THE PREFERRED EMBODIMENTS

Figure 1:
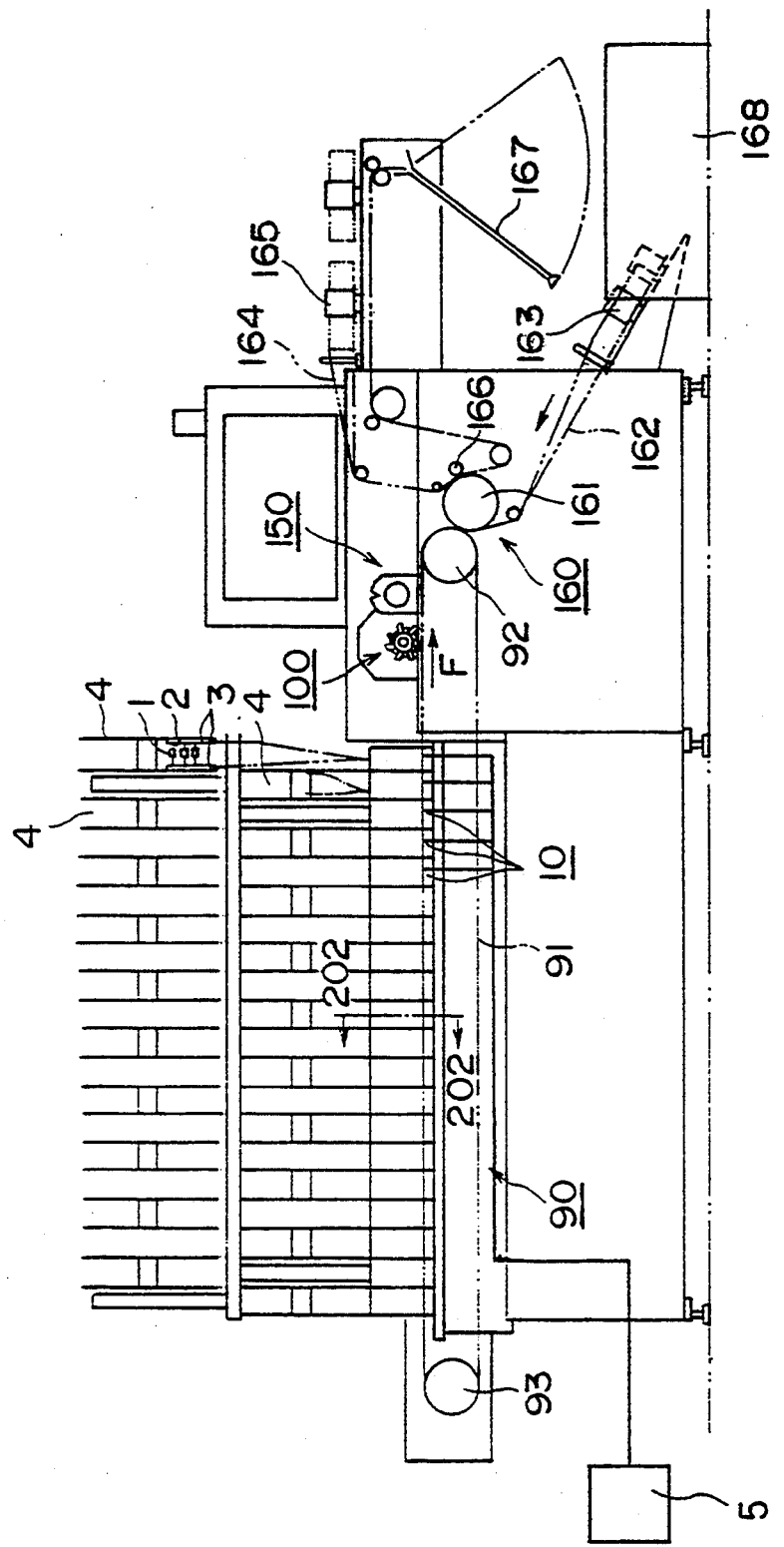
FIG. 1 is a front elevation view of an apparatus in accordance with the invention.

With reference to FIG. 1 of the drawings, an apparatus in accordance with the invention comprises a separation means 10, which receives a strip of electronic parts secured to each other by tapes 3. The tapes 3 are parallel and secure the electronic parts together by engaging the leads on opposite sides of the electronic parts. Transportation means 90 receives the electronic parts after they are separated from the tapes by the separation means 10 and transports them to a tape chip removal means 100 for removal of the tape chips that remain at the ends of the lead wires after the tapes have been cut. A shift means 150 shifts the electronic parts 1 after the tape chips have been removed to a holding position on a holder of the transportation means 90. The parts are then carried to a retaping means 160 for retaping the electronic parts 1 for subsequent automatic assembly onto a circuit board.

The tapes 3 which connect the lead wires 2 of the electronic parts 1 to each other are typically supplied on a reel 4, but they may be supplied folded in a storage box (not shown). The reels 4 of parts are shown for illustration arranged above the separation means 10 in two stories of ten reels each. Twenty separation means 10 are arranged such that each corresponds with a single taping reel 4. The operation of the machine shown in FIG. 1 is controlled by a controller 5.

The structure of the separation means 10 is shown in detail in FIGS. 2 through 8. A body 11 is fixed to a framework 12 by a screw shaft 13. Both sides of a width adjustment shaft 14 are rotatably supported by the side walls 11a and 11b of the body 11. A screw member 15 having a left-handed screw portion 15a and a right-handed screw portion 15b is fixed on width adjustment shaft 14. One of a pair of tape guide plates 16 is movably supported by the left-handed screw portion 15a, and the other of the guide plates is supported by the right-handed screw portion 15b of the screw member 15. Each of the tape guide plates 16 has a guide groove 16a on its surface, and these grooves faces each other to guide a tape 3.

Figure 2:
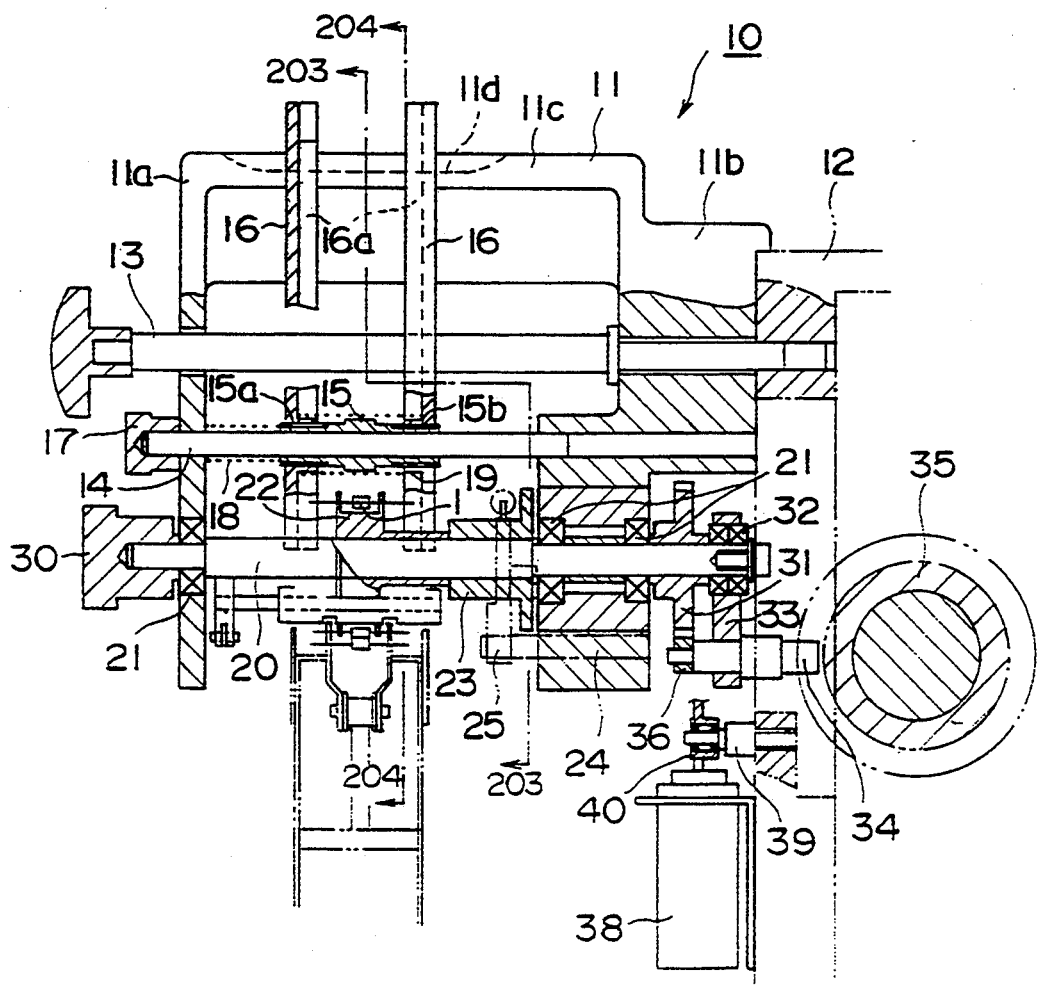
FIG. 2 is a cross section taken along lines 202—202 of FIG. 1.
Figure 3:
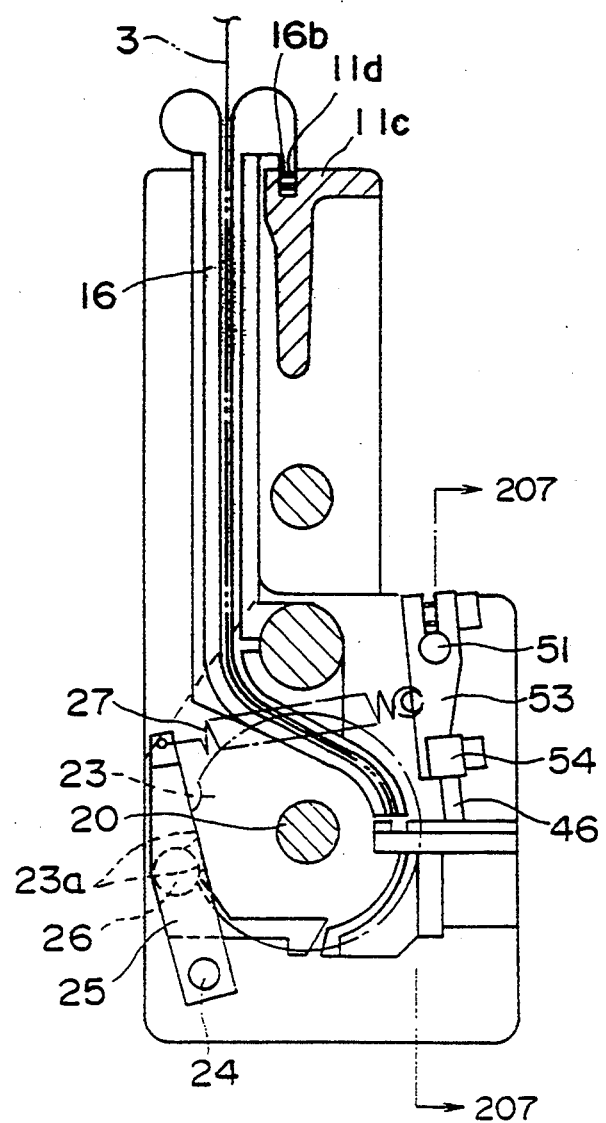
FIG. 3 is a cross section taken along lines 203—203 of FIG. 2.

As shown in FIG. 3, the upper wall 11c of the body 11 has a groove 11d extending parallel to the width adjustment shaft 14. A projection 16b on the top end of the tape guide plate 16 slidably fits in the groove 11d. Referring again to FIG. 2, a knob 17 is fixed to the width adjustment shaft 14 at the external part of the side wall 11a. A spring 18 is arranged around the width adjustment shaft 14 between the side wall 11a and the screw member 15 for allowing the knob 17 to be pressed toward the side wall 11a. A spring 19 is arranged around the screw member 15 to urge the tape guide plates 16 apart for removing the play in the screw of the tape guide plate 16.

Rotation of the knob 17 causes the tape guide plates 16 to move toward or away from each other because of the action of the left-handed screw portion 15a and the right-handed screw portion 15b, thus allowing the distance between the facing guide grooves 16a to be adjusted to the distance between the tapes 3.

A tape feeder shaft 20 is arranged beneath the width adjustment shaft 14 and is rotatably supported by bearings 21, which are fixed to the side walls 11a and 11b of the body 11. A toothed wheel 22 (FIGS. 2 and 4) is fixed to the tape feeder shaft 20. The toothed wheel 22 has supporting grooves 22a which engage the axial lead wires 2 of the electronic parts 1, the V-shaped supporting grooves 22a being spaced by the distance equal to the distance between the tapes 3. The lower ends of the guide grooves 16a of the tape guide plates 16 extend downward to a position approximately 90 degrees along the supporting grooves 22a from the top of the toothed wheel 22.

Referring now to FIGS. 2 and 3, a locating wheel 23 is fixed to the tape feeder shaft 20. The locating wheel 23 has locating grooves with an angular pitch identical to that of the supporting grooves 22a of the toothed wheel 22. A supporting shaft 24 is fixed to the side wall 11b of the body 11, and a lever 25 is rotatably supported by the supporting shaft 24. A roller 26 is rotatably supported by the lever 25 for engaging the locating groove 23a, and a spring 27 extends between the lever 25 and the side wall 11b to press the roller 26 against the locating groove 23a.

Figure 5:
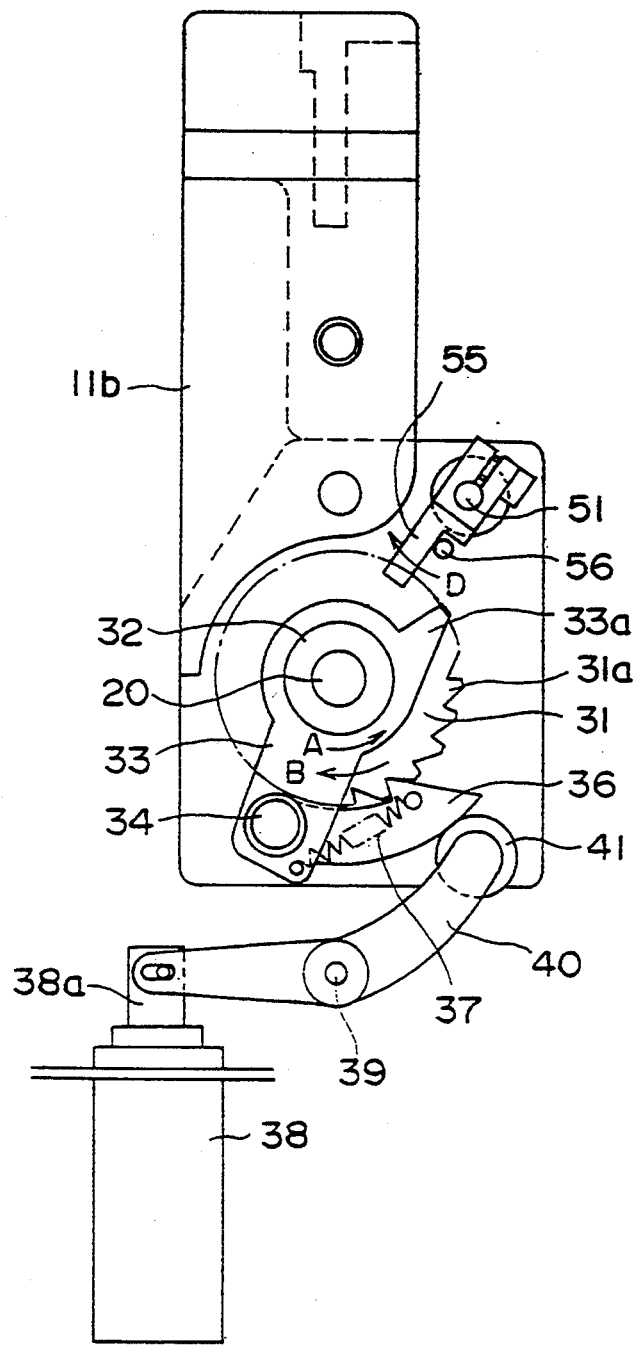
FIG. 5 is an elevation view of the structure shown in FIG. 2, looking from the right side of FIG. 2.
Figure 6:
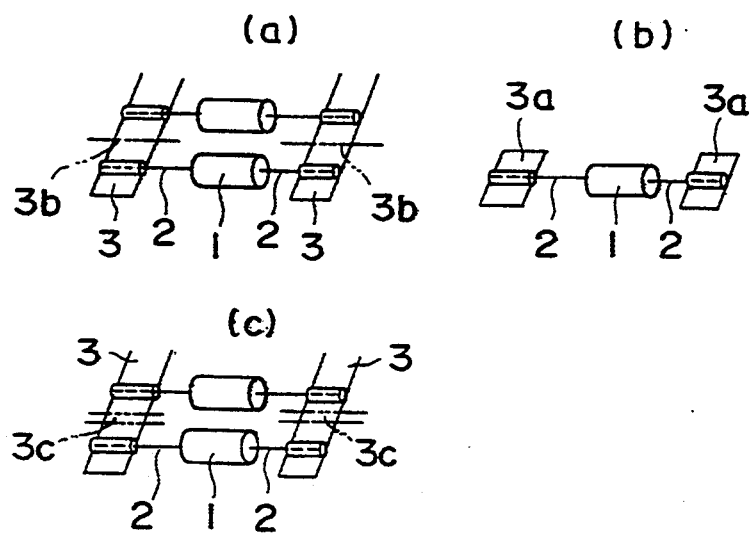
FIG. 6a is a perspective of a portion of a strip of electronic parts showing the locations where the tapes are cut in accordance with one embodiment of the invention.
FIG. 6b is a perspective of a portion of a strip of electronic parts showing the locations where the tapes are cut in accordance with a second embodiment of the invention.
FIG. 6c is a perspective of a separated component having tape chips remaining thereon.

With reference to FIGS. 2 and 5, a knob 30 is fixed to the tape feeder shaft 20 at the external part of the side wall 11a, and a ratchet wheel 31 is fixed to the tape feeder shaft 20 at the external part of the side wall 11b. A swinging lever 33 is rotatably supported by a bearing 32 which supports the tape feeder shaft 20. A working axis 34 is fixed to the swinging lever 33. The working axis 34 is driven by a cam 35 that is in turn driven by a driving means (not shown) and is caused to swing in the directions of arrows A and B around the tape feeder shaft 20, as illustrated in FIG. 5. A claw 36 (FIG. 5) is rotatably supported by the working axis 34. The claw 36 engages with a tooth 31a of the ratchet wheel 31, the teeth 31a being arranged with an angular pitch that is identical to that of the supporting grooves 22a and of the locating grooves 23a of the locating wheel 23. A spring 37 is provided to pull the claw away from the teeth 31a of the ratchet wheel 31. A solenoid 38 (FIGS. 2 and 5) is fixed to the framework 12 for driving the claw 36 to engage a tooth 31a of the ratchet wheel 31. A plunger 38a of the solenoid 38 is linked with one end of a backup lever 40 rotatably supported by an axis 39 fixed to the frame work 12. The other end of the backup lever 40 is attached by a roller 41, which drives the claw 36 to engage with the tooth 31a of the ratchet wheel 31.

If the plunger 38a of the solenoid 38 is moved downward, the roller 41 causes the claw 36 to engage with the tooth 31a of the ratchet wheel 31. This position causes the working axis 34 to swing in the directions of arrows A and B to rotate the ratchet wheel 31, the tape feeder shaft 20, and the toothed wheel 22 in the direction of arrow B by one pitch. Since the lead wire 2 of the electronic parts 1 is supported by the supporting groove 22a of the toothed wheel 22, the electronic parts 1 are thereby fed by one pitch, and the tapes 3, which connect each of the both ends of the lead wires 2 are guided by the guide groove 16a of the tape guide plate 16, thus feeding one piece of the taped electronic parts 1 out of the taping reel 4.

Figure 4:
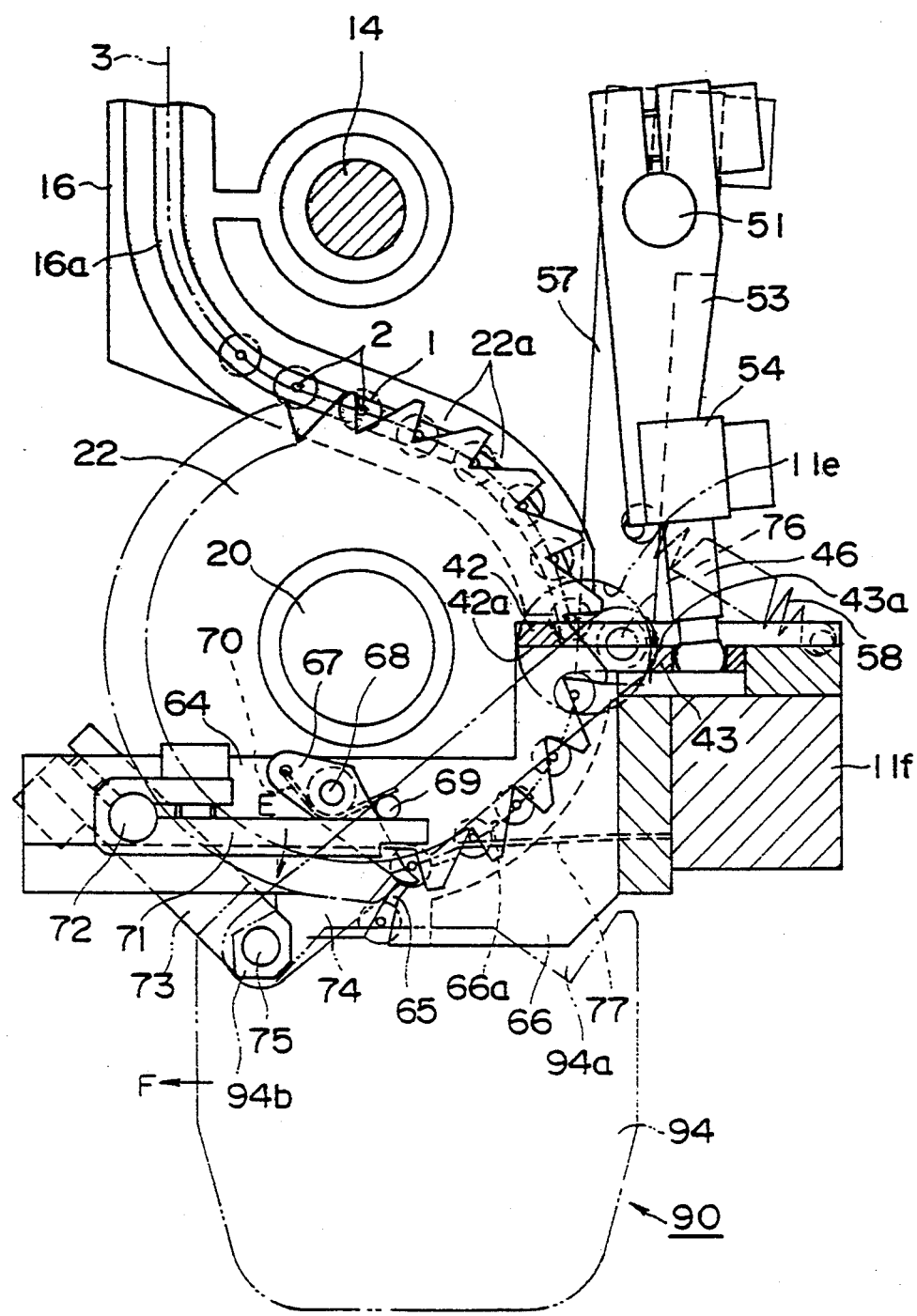
FIG. 4 is a cross section taken along lines 204—204 of FIG. 2.
Figure 7:
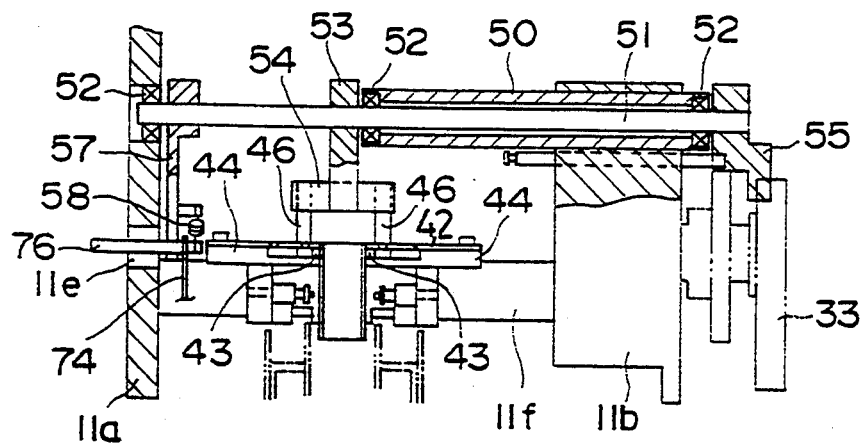
FIG. 7 is a cross section taken along lines 207—207 of FIG. 3.
Figure 8:
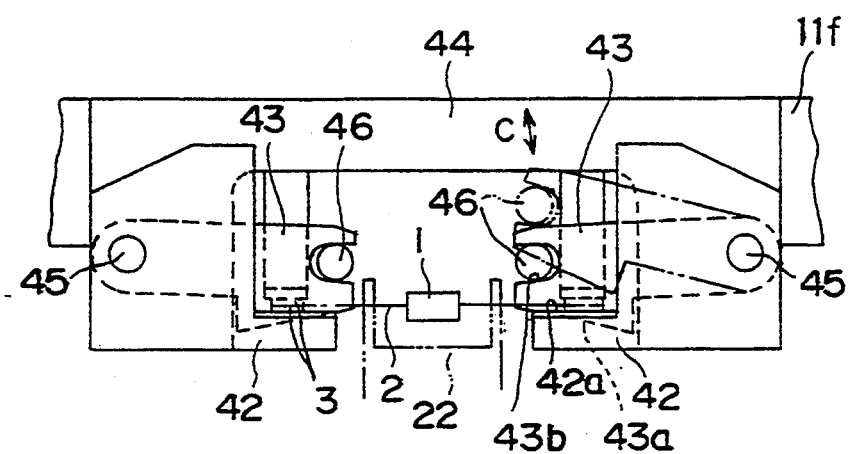
FIG. 8 is a top plan view of the tape cutting device shown in FIG. 4.

Referring to FIGS. 4, 7 and 8, a fixed blade 42 having a cutting blade edge 42a and a movable blade 43 having a cutting blade edge 43a are arranged adjacent the lower end of the guide groove 16a of the tape guide plate 16. The fixed blade 42 is secured to a-blade holder plate 44 on beam 11f which inwardly extends from the side walls 11a and 11b. As shown in FIG. 8, the movable blade 43 is rotatably supported by an axis 45 extending from the blade holder plate 44. The movable blade 43 has a groove 43b, which is penetrated by a working axis 46. Therefore, the movement of the working axis 46 in the directions of the arrow C causes the blade edge 42a of the fixed-blade 42 and the blade edge 43a of the movable blade 43 to cut the tape 3 connecting the lead wires 2.

The mechanism by which the working axis 46 causes the movable blade 43 to swing is shown in FIGS. 3, 4, 5, 7 and 8. A bearing holder 50 is fixed to the side wall 11b. An axis 51 is rotatably supported by bearings 52, each of which is supported by the side wall 11a and the bearing holder 50. A swinging lever 53 is fixed to a part of the axis 51, the part being close to the movable blade 43. A working axis holder 54 is fixed to the swinging lever 53. The working axis 46 is fixed to the working axis holder 54. Referring to FIG. 7, a swinging lever 55 is hung over the side wall 11b and is rotatably supported by the axis 51. A work piece 33a which works on the swinging lever 55 is arranged on the swinging lever 33 which rotates the ratchet wheel 31. A stop 56, which determines the initial point of the swinging lever 55, is fixed on the side wall 11b. Referring to FIGS. 4 and 7, a retracing lever 57 is fixed on the axis 51 in the neighborhood of the side wall 11a. A spring 58 is stretched between the retracing lever 57 and the side wall 11a for continually pressing the swinging lever 55 toward the stopper 56.

Therefore, referring to FIG. 5, movement of the swinging lever 33 in the direction of the arrow A causes the swinging lever 55 or the axis 51 to rotate in the direction of the arrow D against the spring 58. When the swinging lever 33 rotates in the direction of the arrow A, the claw 36 does not engage with the ratchet wheel 31 and does not rotate the ratchet wheel 31. In other words, when the tape 3 is stationary, the axis 51 is rotated in the direction of the arrow D. Rotation of the axis 51 causes the working axis 46 to swing toward the left in FIG. 4 by the swinging lever 53 and the working axis holder 54, both of which are illustrated in FIGS. 4 and 7, causing the movable blade 43 illustrated in FIGS. 4 and 8 to move toward the fixed blade 42. As a result, referring to FIG. 6a, the tape 3 is cut at the middle point 3b between the lead wires 2 of the electronic parts 1. Therefore, as shown in FIG. 6b, the electronic parts 1 are disconnected, leaving tape chips 3a at opposite ends of the lead wires 2. Rotation of the swinging lever 33 in the direction of the arrow B causes the spring 58 to allow the axis 51 to rotate in the reverse direction. As a result, the movable blade 43 moves away from the fixed blade 42.

Referring to FIG. 4, the electronic parts 1 having tape chips 3a at the ends of the lead wires 2 are held between the supporting grooves 22a of the toothed wheel 22 and the supporter 66a of the supporting plate 66 and are transported to the exit 65 arranged above the transportation means 90. Supporting plate 66 provides a space that is slightly larger than the diameter of the lead wire 2 between the bottom of the supporting groove 22a of the toothed wheel 22 and the supporter 66a, and is fixed to the beam 11f of the body 11 to allow the upper end of the supporting plate 66 to continue to the lower end of the guide groove 16a of the tape guide plate 16. The electronic parts 1 are supported by a stopper lever 67 to prevent them from dropping. The stopper lever 67 is rotatably supported by a shaft 68 fixed to a supporting member, and a torsion spring 70 presses the stopper lever 67 to a stopper 69 to prevent the stopper lever 67 from rising.

A scraping lever 71 is arranged slightly above the bottom surface of the supporting groove 22a above the exit 65 for forcing an electronic part 1 supported by the stopper lever 67 to the exit 65. The scraping lever 71 is fixed to a supporting shaft 72 rotatably supported by the supporting member 64. The supporting shaft 72 is connected to the retracing lever 57 illustrated in FIG. 7 by connection levers 73 and 74 for rotation with the movable blade 43. Referring to FIGS. 4 and 7, one end of the connection lever 73 is fixed to the supporting shaft 72, and the other end of the connection lever 73 is rotatably connected to one end of the connection lever 74 by a pin 75. The other end of the connection lever 74 is rotatably connected to the retracing lever 57 by means of a manual lever 76 which works also as a connection pin. The manual lever 76 juts out of the side wall 11a through a through hole 11e.

In operation, the swinging lever 33 rotates in the direction of arrow A to rotate the axis 51, and the movable blade 43 illustrated in FIG. 4 cuts the continuous tape 3 to separate the electronic parts 1 to provide separated electronic parts having tape chips 3a at the opposite ends of its lead wires 2. The retracing lever 57 illustrated in FIG. 7 rotates the supporting shaft 72 by means of manual lever 76, the connection lever 74 illustrated in FIG. 4, the pin 75 and the connection lever 73. Therefore, the scraping lever 71 rotates in the direction of the arrow E (See FIG. 4) to provide the electronic parts 1 having tape chips 3a at the ends of its lead wires I. 2, the electronic parts 1 being held above the exit 65 of the toothed wheel 22 against the torsion spring 70 energizing the stopper lever 67. In other words, the electronic parts 1 remaining above the exit 65 do not naturally drop but are, instead, forcibly delivered. Therefore, each of the electronic parts 1 is forcibly separated, even if the tape chips 3a of the preceding electronic part 1 stick to those of the succeeding electronic part 1. Particularly, in this embodiment, the electronic part 1 following the electronic part 1 held above the exit 65 is pressed against the bottom of the supporting groove 22a. This ensures that each of the electronic parts 1 is disconnected.

Figure 9:
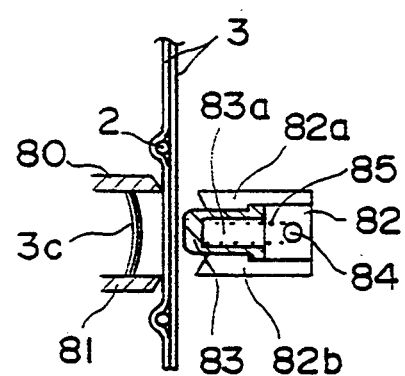
FIG. 9 is a cross section of a second embodiment of a tape cutting apparatus.

In the foregoing embodiment, the tape 3 is cut simply along the line 3b (See FIG. 6a) by the edges 42a and 43a of the fixed blade 42 and the moving blade 43. The adhesives can, thus, flow out of the tape around the cutting edges of the tape chip 3a, and such tape chips 3a are inclined to stick to each other. The foregoing embodiment accounts for this drawback by forcibly delivering each of the electronic parts 1. The drawback, however, may be eliminated by the cutter illustrated in FIG. 9. In accordance with a second embodiment the tape 3 is cut along two closely adjacent lines as illustrated in FIG. 6c and the narrow strips of the cut tape 3c are removed. Referring to FIG. 9, a pair of fixed blades 80 and 81 is arranged on one side of the tape 3, and another pair of movable blade 82 having blades 82a and 82b is arranged to face the fixed blades 80 and 81 on the other side of the tape 3. Blades 82a and 82b of the movable blade 82 are arranged to precisely face the fixed blades 80 and 81. A knockout pin 83 is slidably arranged in the movable blade 82. The rear of the knockout pin 83 is made a hollow space 83a in which a spring 85 is stretched between the rear surface of the knockout pin 83 and a pin 84 to allow the spring 85 to drive the movable blade 82 toward the fixed blades 80 and 81.

As the movable blade 82 reciprocates by means of the mechanism similar to that of the working axis 46, narrow strips 3c of the tape 3 having a width identical to that of the fixed blades 80 and 81 are cut out of the tape 3, and they are removed by the knockout pin 83. This ensures one by one delivery of the electronic parts 1 to the transportation means 90 without the possibility that the tape chips 3a will stick to each other. It will be appreciated that this second embodiment does not require scraping lever 71 and associated structure.

Figure 10:
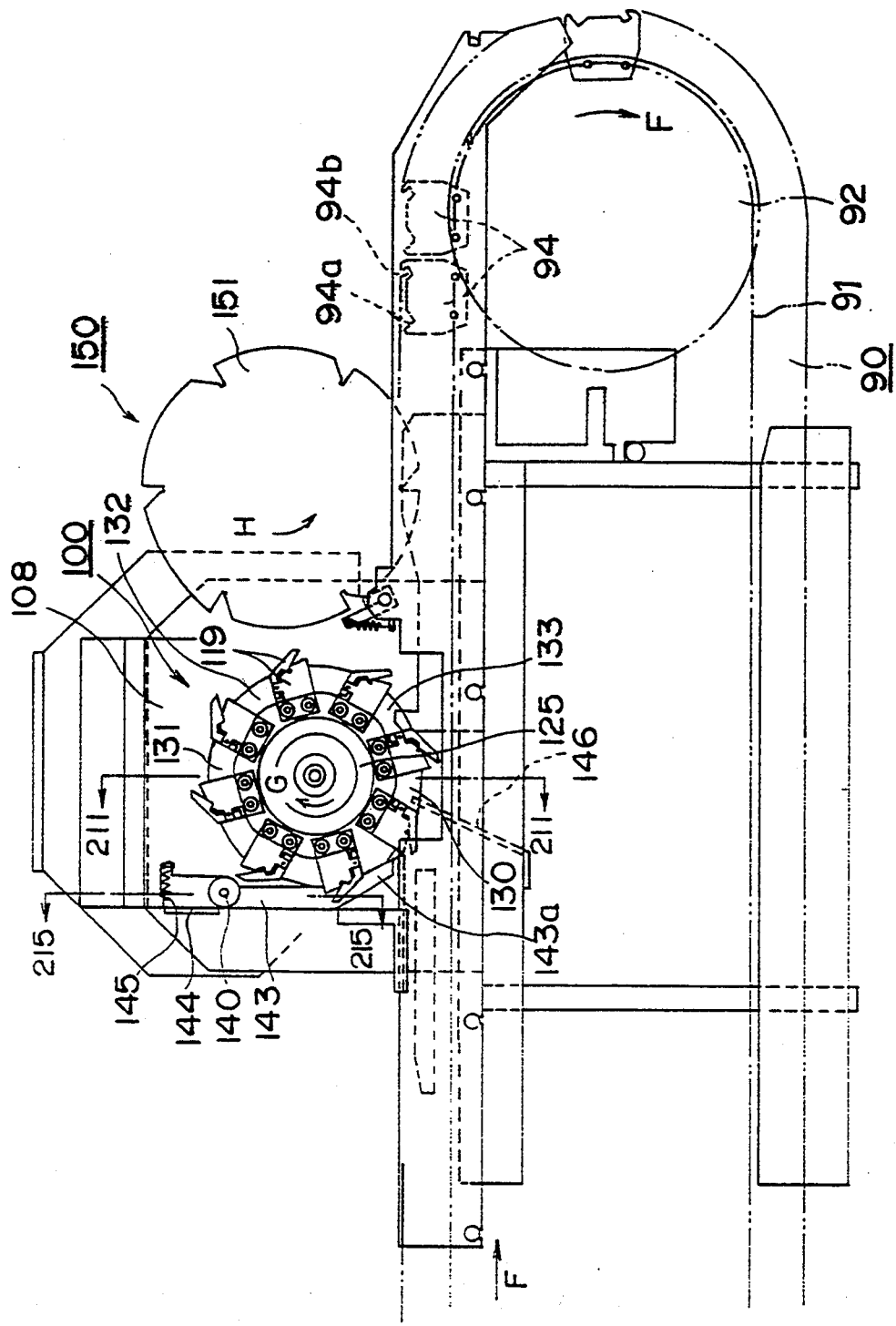
FIG. 10 is a side view of an apparatus for removing tape chips.

The transportation means 90 of this embodiment is similar to that employed in the prior art. An endless transportation chain 91 driven by a driving sprocket 92 and a driven sprocket 93 is arranged under the separation means 10 illustrated in FIG. 1. Referring to FIG. 10, the transportation chain 91 proceeds in the direction of the arrow F, and plural pairs of supporting members 94, which locate and hold electronic parts 1, are arranged to the transportation chain 91 remaining an equal interval therebetween. The supporting member 94 has a first supporting part 94a, which is located at the rear position of the supporting member 94 and a second supporting part 94b, which is located at the front position of the supporting member 94. Two supporting members 94 are arranged in parallel to each other remaining a predetermined space therebetween, and hold the lead wires 2 of electronic parts 1 thereon.

Operation of the plural separation means 10 to produce electronic parts 1 having tape chips 3a at the ends of the lead wires 2 and supply of them to the transportation means 90 are regulated by a regulator 5 to feed the electronic parts 1 onto the first supporting parts 94a of the supporting members 94 in the predetermined order which is required by the corresponding automatic electronic parts mounting machine. In this manner, the electronic parts having tape chips 3a at the ends of the lead wires 2 are transported by the transportation means 90, the transportation chain 91 of which proceeds in the direction of the arrow F, toward the tape chip removal means 100.

Referring to FIGS. 10 through 16, the structure of the tape chip removal means 100 will be described. A supporting shaft 102 (See FIGS. 10 through 12) extends horizontally from a supporting plate 101 which is arranged in the vertical direction. A rotor 104 is rotatably supported by a bearing 103 which is fixed to the supporting shaft 102. The rotor 104 supports a gear 105 which engages with the other gear which rotates in conjunction with the driving sprocket 92 of the transportation chain 91. Plural pairs (eight in this embodiment) of guide shafts 106 are equally spaced around the external surface of the rotor 104. Each pair of guide shafts 106 supports an electronic part holder 107, which is located between the supporting members 94 of the transportation means 90. The electronic part holder 107 has a hollow space for receiving an element 1a of an electronic part 1 and supporters 107a, which support the lead wire 2, also acts as stops for the element 1a. A fixed guide plate 108 surrounds the external surface of the electronic part holder 107, except for a region of 45 degrees spreading from the lower point of the supporting shaft 102. The fixed guide plate 108 is supported by a supporting plate 109 which is further supported by the supporting plate 101.

Figure 11:
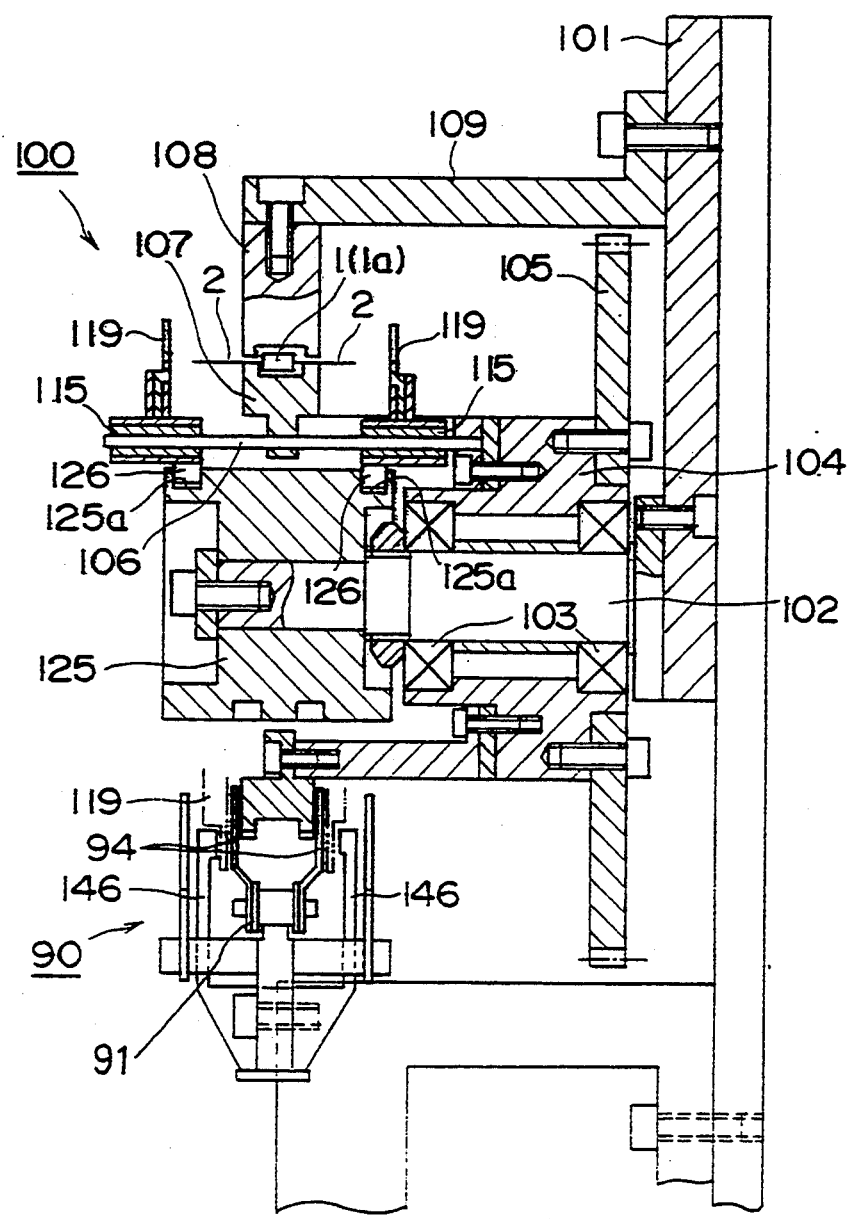
FIG. 11 is a cross section taken along line 211—211 of FIG. 10.
Figure 12:
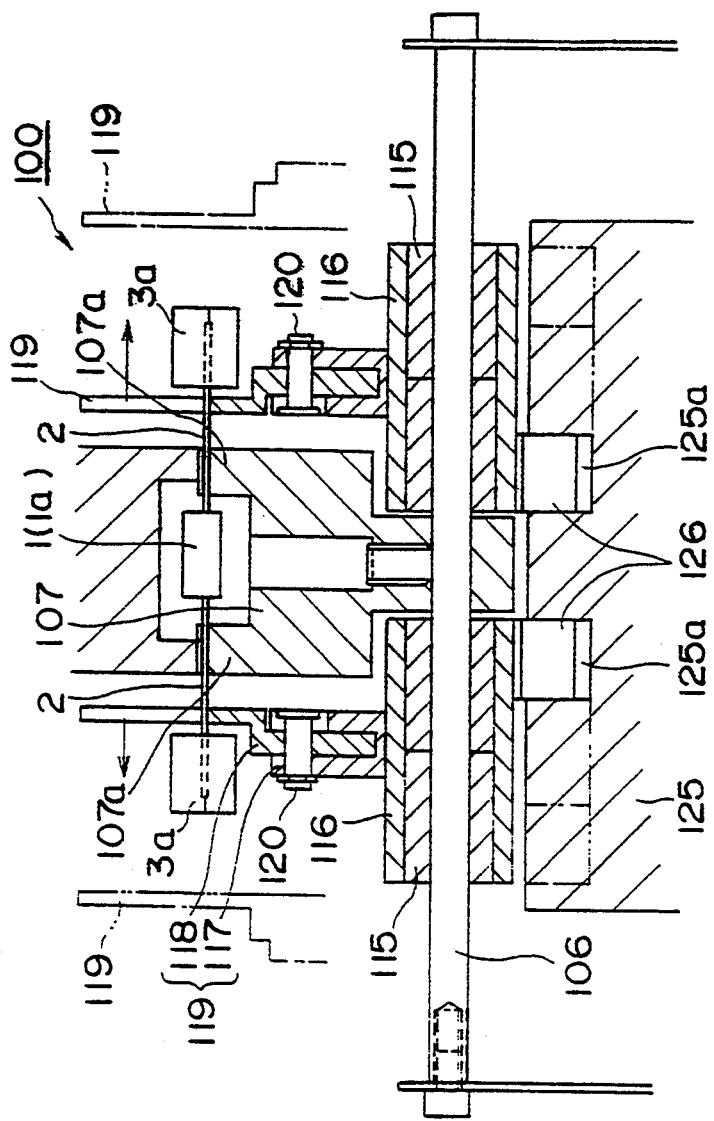
FIG. 12 is an enlarged sectional view of a tape chip removal device.
Figure 13:
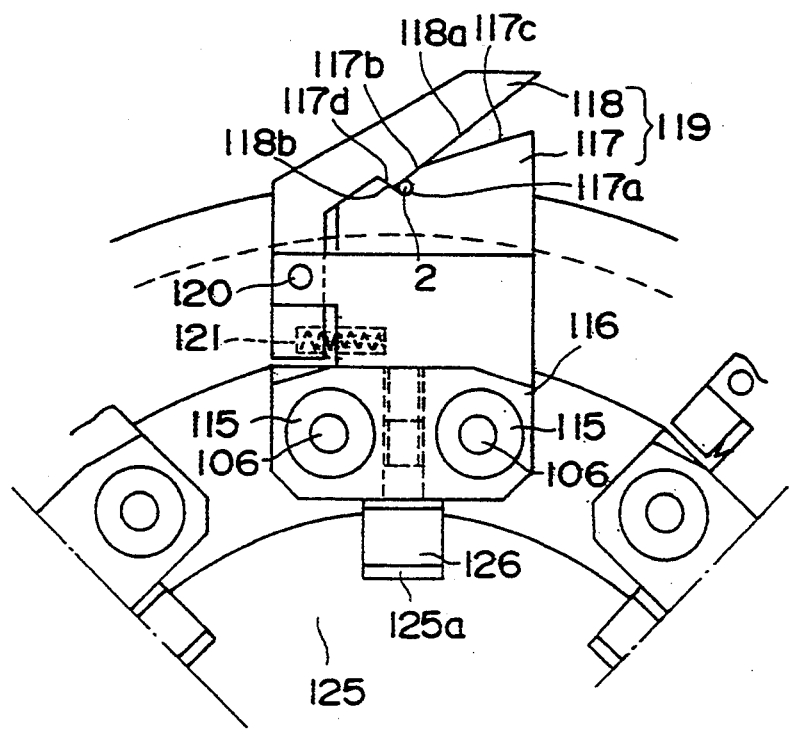
FIG. 13 is a front view of a first embodiment of a tape chip removal device.

With reference to FIGS. 11 through 13, a pair of claw holders 116 is slidably supported by a pair of bearings 115 on each pair of the guide shafts 106, the claw holders 116 and the bearings 115 being arranged on the both sides of the electronic part holder 107. The claw holder 116 supports a tape chip drawing out jig 119 consisting of a tape chip drawing out fixed claw 117 and a tape chip drawing out movable claw 118. The tape chip drawing out fixed claw 117 which is supported by the claw holder has a lead wire supporting groove 117a which supports the lead wire 2 of the electronic part 1. On one side of the lead wire supporting groove 117a, a second lead wire guide slope 117b which is a slope which guides the lead wire 2 toward the lead wire supporting groove 117a and a first lead wire guide slope 117c which is at an angle smaller than that of the second lead wire guide slope 117b are provided. On the other side of the lead wire supporting groove 117a, a step 117d is provided to the tape chip drawing out fixed claw 117, so that the surface of the other side is prevented from forming the same flat surface as the second lead wire guide slope 117b. The tape chip drawing out movable claw 118 is rotatably supported by a shaft 120 fixed to the claw holder 116. A lead wire guide slope 118a whose inclination is approximately identical to that of the second lead wire guide slope 117b is provided to the tape chip drawing out movable claw 118 at a location corresponding to the lead wire supporting groove 117a, the second lead wire guide slope 117b and the first lead wire guide slope 117c. A step 118b which is similar to the step 117d is provided to the tape chip drawing out movable claw 118 at a location corresponding to the step 117d. The tape chip drawing out movable claw 118 is provided with a spring 121, which presses the lead wire guide slope 118a of the tape chip drawing out movable claw 118 against the second lead wire guide slope 117b of the tape chip drawing out fixed claw 117.

Referring to FIG. 11, a cam cylinder 125 is supported by the supporting shaft 102, the cam cylinder 125 being located in the center of array of the guide shafts 106. A pair of cam grooves 125a is provided on the external surface of the cam cylinder 125. A roller 126 is inserted in the cam groove 125a and is rotatably supported by the claw holder 116. The cam groove 125a is symmetrical in the horizontal direction for allowing the electronic part holder 107 to be centrally located. With reference to FIG. 10, the tape chip drawing out jigs 119 become close to each other as the tape chip drawing out jigs 119 moves in the direction of arrow G from the position indicated at 130 to the position indicated at 131, as is illustrated in the solid line in FIG. 12. As the tape chip drawing out jigs 119 move from position indicated at 131 to that indicated at 132 in the direction of the Circular arrow G they move apart from each other and toward the tape chips 3a. At the position indicated at 132, the tape chip drawing out jigs 119 have moved to the position illustrated in the chained line in FIG. 12. As the tape chip drawing out jigs 119 move from the position indicated at 132 to the position at 133 they stay at the distance illustrated by the chained line in FIG. 12.

Figure 15:
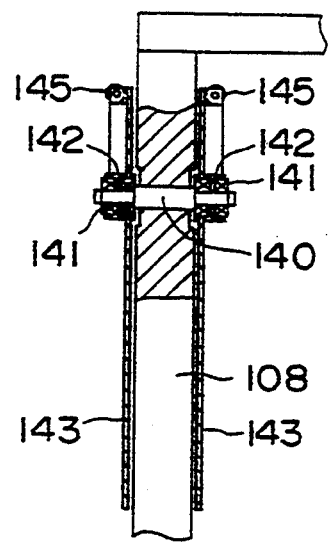
FIG. 15 is a cross section taken along line 215—215 of FIG. 10.
Figure 16:
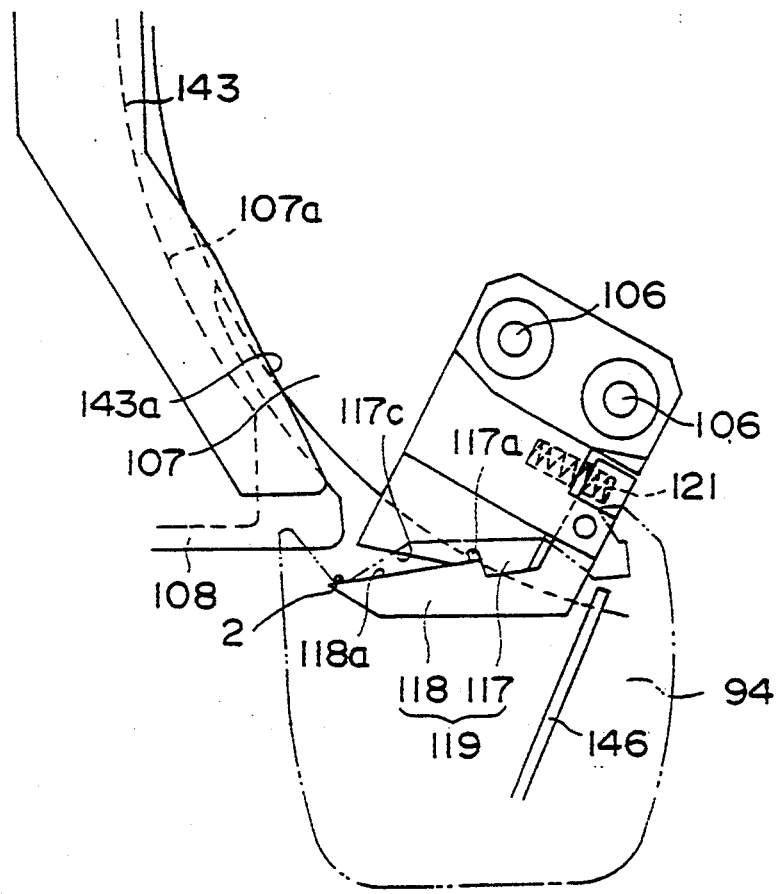
FIG. 16 is a partial front view of FIG. 10 showing the push in lever and a tape chip removing device.

Referring to FIGS. 10, 15 and 16, the fixed guide plate 108 supports a shaft 140 at its upper part in the side at which the tape chip removal means 100 receives an electronic part 1 from the supporting part 94a of the transportation means 90. A pair of lever holders 142 is rotatably supported by bearings 141 arranged at the both sides of the shaft 140. A pushing-in lever 143 having a pushing-in member 143a is fixed to the lever holder 142. A stopper 144 which determines the position at which the pushing-in member 143a of the pushing-in lever 143 faces the tape chip drawing out jig 119, is fixed to the fixed guide plate 108. A spring 145 is stretched between the pushing-in lever 143 and the stopper 144 to allow the pushing-in lever 143 to be pushed against the stopper 144.

The function of the tape chip removal means 100 will be described below. When the supporting member 94, which is driven by the transportation chain 91 in the direction F, has transported an electronic part 1 to the neighborhood of the tape chip removal means 100, the gear 105 is caused to rotate in conjunction with the driving sprocket 92 of the transportation chain 91, thus rotating the rotor 104 in the direction of the circular arrow G. Since the guide shaft 106 is fixed to the rotor 104 and also since the tape chip drawing out jigs 119 are arranged on the guide shaft 106, the tape chip drawing out jigs 119 are caused to rotate together with the rotor 104. Therefore, as illustrated in FIG. 16, an electronic part 1 that is supported on the first supporting part 94a of the supporting member 94 is picked off the supporting part by the lead wire guide slope 118a of the tape chip drawing out movable claw 118, and moves along the lead wire guide slope 118a toward the innermost of the lead wire guide slope 118a and the first lead wire guide slope 117c. The lead wires 2 cannot move as far as groove 117a, however, because the tape chip drawing out movable claw 118 is pressed toward the tape chip drawing out fixed claw 117 by the spring 121.

As the rotor 104 moves in the direction of the arrow G, the lead wires 2 contact the pushing-in member 143a of the pushing-in lever 143. The pushing-in lever 143, resiliently supported by the spring 145, moves the lead wire 2 to force the tape chip drawing out movable claw 118 to move against the force of spring 121. In this manner, lead wires 2 are pushed in along the first lead wire guide slope 117c of the tape chip drawing out fixed claw 117 toward the lead wire supporting groove 117a of the tape chip drawing out fixed claw 117. The lead wires 2 enter the supporter 107a of the electronic part holder 107 and are held there.

FIG. 12 illustrates the situation where the tape chip drawing out jig 119 has been moved by the rollers, as they move in cam grooves 125a in response to rotation of the rotor, to a position where the tape chip drawing out jig 119 and the claw holder 116 are beyond the lead wires 2. This pushes the tape chips 3a from the lead wires 2. If the tape chips 3a of the both sides are not pushed off at the same rate, any side shift of the element 1a will be stopped when the end of the element 1a contacts the inner wall of the supporter 107a of the electronic part holder 107. As a result, the tape chip 3a on the other side of the electronic part 1 will be pushed off.

If the tape chip drawing out fixed claw 117 contacts the tape chip drawing out movable claw 118 in a straight line, there is the possibility that a part of the tape chip 3a will be caught between them and the tape chip will not be pushed off. This is particularly so when the edge of the tape chip 3a is parallel to the joint surface of the tape chip drawing out fixed claw 117 and the tape chip drawing out movable claw 118. In this embodiment, however, the sides 117b and 117d of the lead wire supporting groove 117a, which holds the lead wire 2, are offset from each other. Similarly, sides 118a and 118b are offset. Thus, the tape chip 3a will be drawn out regardless of the direction of the edge of the tape chip 3a.

Figure 14:
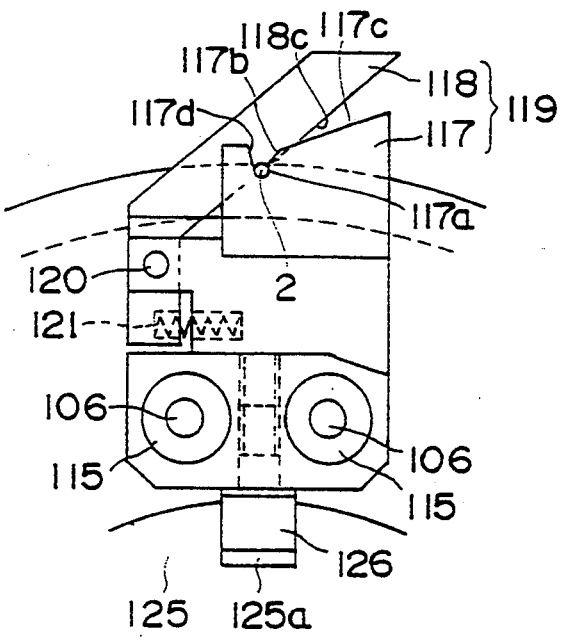
FIG. 14 is a front view of a second embodiment of a tape chip removal device.

A second embodiment of the tape chip drawing out jig 119 is shown in FIG. 14. The tape chip drawing out fixed claw 117 in this embodiment is similar to that illustrated in FIG. 13, but the tape chip drawing out movable claw 118 has a lead wire guide slope 118c which extends in one straight line on both sides of the part which holds the lead wire 2. In this case, however, a step 117d overlaps with and crosses the guide 118c to prevent the tape chip 3a from being caught between the joint surface of the tape chip drawing out fixed claw 117 and the tape chip drawing out movable claw 118.

Since the tape chip drawing out jig 119 is located outside the lead wire 2 during the period in which the electronic part is located between the locations indicated at 132 and 133, the electronic part 1 is held by the supporter 107a of the electronic holder 107 after it passes the position at 132. As the tape chip drawing out jig 119 rotates beyond the position at 132 to the position at 133, the electronic part 1 drops onto the first supporting part 94a of the supporting member.

Because the tape chip 3a is an adhesive tape, it is possible for the tape chip 3a to stick to the tape chip drawing out jig 119. If a tape chip 3a is stuck to the drawing out jig 119 as it tries to scoop under an electronic part 1 from the supporting member, the tape chip 3a which has stuck to the tape chip drawing out jig 119 can prevent the electronic part 1 from being held by the lead wire supporting groove 117a of the tape chip drawing out fixed claw 117. If this occurs, the electronic part 1 and the tape chip drawing out jig 119 will likely be destroyed. To prevent this from happening, a tape chip remover plate 146, shown in FIGS. 10 and 11, is arranged in the path of the transportation chain 91. The tape chip remover plate 146 removes the tape chips 3a between the time at which the tape chip drawing out jig 119 releases the electronic part 1 from which the tape chips have been drawn out and the time at which the tape chip drawing out jig 119 scoops up the next electronic part 1.

Referring to FIG. 10, a shift means 150 that is similar to that used in the prior art is shown. The shift means includes a shift drum 151 that rotates in the direction of the arrow H to engage an electronic part 1 held by the first supporting part 94a of the supporting member 94 and Shifts it to the second supporting part 94b of the supporting member 94.

Referring to FIG. 1, the structure and the function of the retaping means 160 will be described. The retaping means 160 is similar to that known in the art and need not be described in detail here. Plural serrated grooves which support and transport the lead wire 2 of the electronic part 1 are arranged on the external surface of a taping drum 161 with a spacing equal to the pitch with which the retaping will be conducted. Both ends of the taping drum 161 are cylinders having diameters equal to that of bottoms of the teeth of the serrated groove, and an adhesive base tape 162 is fed by a base tape feeder reel 163. The lead wires 2 of the electronic part 1 which is fed to the groove of the taping drum 161 from the second supporting part 94a of the supporting member 94 are caused to contact the base tape 162.

A pressing down tape supply reel 165 feeds a pressing down adhesive tape 164 to the latter part of the taping drum 161, which has already been supplied with an electronic part 1. The lead wires 2 of the electronic part 1 are then retaped by being pressed between the base tape 162 and the pressing down tape 164. The retaped electronic parts are folded by a swinging arm for folding electronic parts 167, before the folded electronic parts i are stored in a storage of folded electronic parts 168.

The separation means 10 of the foregoing embodiment was designed for use with electronic parts wherein the lead wires 2 are short and the continuous tapes 3 are cut to produce the electronic parts 1 attached by tape chips 3a at the end of the lead wires 2. The separation means 10 of the invention may also be used in the situation where the lead wires 2 are long, and the lead wires 2, rather than the tapes 3, are cut to a predetermined length.

Figure 17:
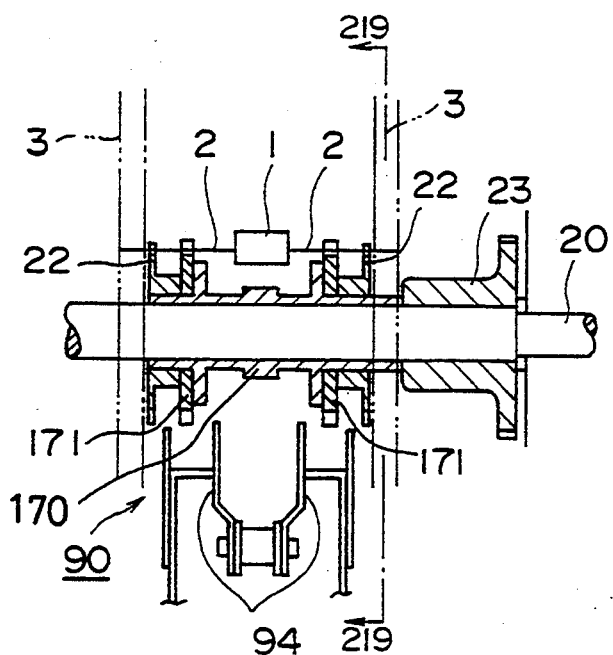
FIG. 17 is a cross section of a second embodiment of a separation device.
Figure 18:
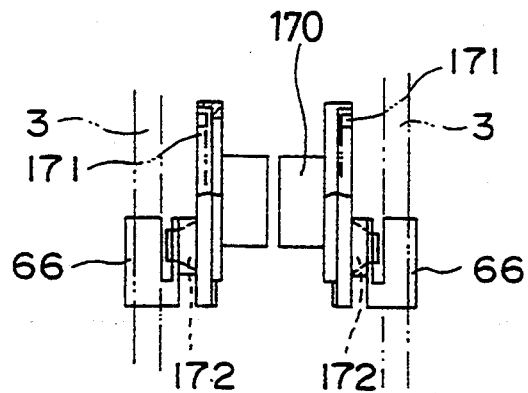
FIG. 18 is a front view of the device shown in FIG. 17.
Figure 19:
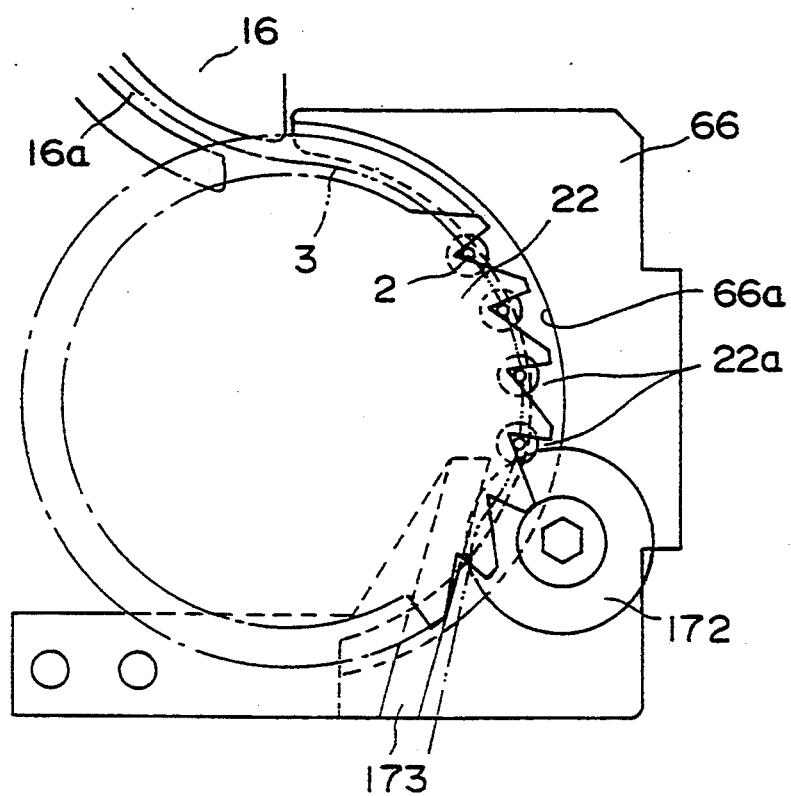
FIG. 19 is a front view of the structure shown in FIG. 17, seen along line 219—219 of FIG. 17.

FIGS. 17 through 19 show a separation means 10 in which long lead wires 2 are shortened to be equal to the length of the lead wires 2 of the electronic parts 1 having short lead wires 2. For the members also illustrated in FIGS. 2 and 4, the same structure as that shown in FIGS. 2 and 4 is used in the embodiment shown in FIGS. 17 through 19. The separation means 10 of this embodiment has a pair of tape guide plates 16 which is identical to the tape guide plate 16 of the foregoing embodiment except that the distance between the tape guide plates 16 is wider to accept the electronic parts 1 having long lead wires 2. A tape feeder shaft 20 supports a fixing holder 170 corresponding to the screw 15 and a locating wheel 23, which is identical to that of the foregoing embodiment. Therefore, locating is accomplished in the same manner as in the foregoing embodiment. The fixing holder 170 is provided a pair of toothed wheels 22 that are also identical to that of the foregoing embodiment. The fixing holder 170 has a pair of movable blades 171 with teeth identical to the supporting grooves 22a of the toothed wheel 22, and the external sides of the teeth are blades. Both sides 11a and 11b (See FIG. 2) of the body 11 are provided with the supporting plate 66 which causes the supporting groove 22a of the toothed wheel 22 to hold the lead wires 2. The supporting plates 66 are provided with fixed blades 172 to cut the lead wires in conjunction with the movable blades 171. The supporting plate 66 is provided a tape avoiding guide plate 173 which guides the tape 3 after the tape 3 is removed from the electronic part 1.

As the tape feeder shaft 20 rotates as described in the foregoing embodiment, the electronic parts 1 connected with the tapes 3 are fed by the toothed wheels 22. The lead wires 2 held by the supporting grooves 22a of the toothed wheels 22 are fed to the location of the fixed blades 172 and are pressed to the fixed blades 172 by the rotation of the movable blades 171. In this manner, the lead wires 2 are cut. After the lead wires 2 are cut, the electronic part 1 is fed to the supporting member 94 of the transportation means 90, as in the case of the foregoing embodiment.

In this embodiment, the toothed wheel 22, which feeds the tape 3 does not have the movable blade, the movable blade 171 being employed independently from the toothed wheel 22. Therefore, the toothed wheel 22 is allowed to be arranged in the neighborhood of the tape 3, removing possibility that the lead wire 2 will bend as the lead wire 2 is fed. The tape 3 from which the electronic part 1 was removed after the lead wires 2 were cut, is guided by the tape avoiding guide plate 173. Therefore, interference between the tapes 3 and the toothed wheels 22 after the lead wires 2 are cut is readily avoided.

In the first embodiment, the steps for retaping are as follows: First, the taped electronic parts 1 are received and the separation means 10 is used to cut the tapes 3 to produce the electronic parts 1 attached by the tape chips 3a. Second, the electronic parts 1 attached by the tape chips 3a are supplied to the supporting members 94 of the transportation means 90. Third, the tape chip removal means 100 receives the electronic parts 1 attached by the tape chips 3a which were transported by the transportation means 90. Fourth, the electronic parts 1 from which the tape chips 3a were removed are supplied to the supporting members 94 of the transportation means 90. Another arrangement is possible, however. In this alternative, the tape chip removal means 100 is arranged in the neighborhood of the separation means 10, and the electronic parts 1 attached by the tape chips 3a are directly supplied to the tape chip removal means 100 which removes the tape chips 3a from the electronic parts 1, before the electronic parts 1 are supplied to the transportation means 90, after the tape chips 3a are removed.

In the foregoing embodiments, the supporting member 94 of the transportation means 90 has the first and second supporting parts 94a and 94b, which requires the shift means 150. However, if the supporting member 94 has one supporting part, shift means 150 is not necessary. In the foregoing embodiments, one transportation means 90 was employed. However, the transportation means may be split into two parts. The first one is to transport the electronic parts 1 attached by the tape chips 3a to the tape chip removal means 100 from the separation means 10, and the second one is to transport the electronic parts 1 from which the tape chips 3a have been removed to the retaping means 160 from the tape chip removal means 100.

We claim:
1. Apparatus for retaping electronic parts comprising:
receiving means for receiving a plurality of electronic parts that are attached to each other by an elongate tape that engages leads of each of said parts,
separating means for separating said electronic parts from said strip by cutting said tape between adjacent ones of said parts, and
means for removing from said lead chips of said tape that remain on said leads after said tape has been cut.

2. Apparatus according to claim 1 wherein said tape comprises first and second tape strips on respective sides of said electronic parts and said separating means comprises means for cutting each of said tape stripes in a direction transverse to a longitudinal direction of said tape.

3. Apparatus according to claim 2 wherein said separating means further comprises body means for guiding said means for cutting in a said transverse direction.

4. Apparatus according to claim 2 wherein said separating means cuts each of said tape strips at two locations between adjacent ones of said parts.

5. Apparatus according to claim 4 further comprising means for withdrawing sections of cut tape between said two locations.

6. Apparatus according to claim 5 wherein said separating means comprises two cutting blades and said means for withdrawing comprises a knockout pin for engaging one side of said tape and urging said sections between said two cutting blades.

7. Apparatus according to claim 1 wherein said means for removing comprises means for holding an electronic part that has been separated from said tape, means for engaging a tape chip attached to said separated electronic part, and means for moving said means for engaging away from said electronic part.

8. Apparatus according to claim 7 wherein said means for engaging comprises a fixed blade and a movable blade and means for controlling said movable blade to cause a lead of said electronic part that has been removed to be engaged by said movable and fixed blades.

9. Apparatus according to claim 7 wherein said means for engaging comprises first and second engaging means on opposite sides of said means for holding.

10. Apparatus according to claim 9 further comprising groove means having grooves therein for moving said first and second engaging means toward and away from each other.

11. Apparatus according to claim 7 further comprising means for retaping said electronic parts.

12. A method for separating parts that are secured together by an elongate strip comprising:
cutting said strip at locations between adjacent ones of said parts to provide separated parts having pieces of said strip remaining on said parts, and
engaging said pieces of said strip and forcing said pieces from said parts.

13. A method according to claim 12 wherein said parts are electronic parts having axially extending leads and said parts are attached to said strip by engagement between said leads and said strip.

14. A method according to claim 13 wherein said step of forcing comprises moving a tape engaging jig away from a said part and in the direction of a said lead.

15. A method according to claim 14 wherein said step of forcing comprises moving two tape engaging jigs away from said part in opposite directions.

16. A method according to claim 15 wherein said step of forcing further comprises transferring said part to a rotor having said two tape engaging jigs thereon, said tape engaging jigs being in contact with grooves for causing said jigs to move toward and away from each other, and driving said rotor with respect to said grooves.

17. A method according to claim 12 wherein said step of cutting comprises cutting said strip transverse to the direction of said strip.

18. A method according to claim 12 wherein said step of cutting comprises removing from said strip a section of said strip between adjacent parts.

19. A method according to claim 12 further comprising supplying said separated parts to means retaping said separated parts to a second strip.

* * * * *